6, in which the reference numerals 22 through 24 indicate specimens Nos. 22 through 24, respectively. It is possible to conclude the following from FIG. 6. (1) Specimens Nos. 22 and 23, containing V and Ta, respectively, according to the present invention, and conventional Cu in a low amount, which is desirable for providing the Sm-Co-Fe-Cu quaternary alloy with a high Br, maintain high iHc with the increase in the Fe content. (2) A high iHc can be obtained in the specimens Nos. 22 and 23 with up to 15% by weight of Fe. (3) A preferable Fe content for (B.H)max is from 8 to 14% and 10 to 13%, by weight.

EXAMPLE 11

Specimens Nos. 25 and 26, having the compositions shown in Table 11, were produced in accordance with the procedure described in Example 1.

Table 11

| Specimen No. | Composition of Alloys (wt. %) | | | | | Br (KG) | iHc (KOe) | (B.H)-max (MG . Oe) |
|---|---|---|---|---|---|---|---|---|
| | Sm | Co | Cu | Fe | Zr | | | |
| 25. (control) | 26.5 | 60.5 | 8.0 | 5.0 | 0 | 9.2 | 3.0 | 12.0 |
| 26. (invention) | 26.5 | 59.5 | 8.0 | 5.0 | 1.0 | 9.1 | 6.5 | 20.5 |

As is clear from Table 11, the addition of Zr considerably improves the iHc of the quaternary system alloy, with the result that the (B.H)max is remarkably enhanced.

EXAMPLE 12

Specimens Nos. 27 and 28, having the compositions as shown in Table 12, were produced in accordance with the procedure described in Example 1.

Table 12

| Specimen No. | Composition of Alloys (wt. %) | | | | |
|---|---|---|---|---|---|
| | Sm | Co | Cu | Fe | Zr |
| 27. (invention) | 26.5 | bal | 8.0 | 0–16 | 1.0 |
| 28. (control) | 26.5 | bal | 8.0 | 0–10.0 | 0 |

The Fe contents were changed with in the ranges shown in Table 12.

The influence of the Fe contents upon the coercive force is illustrated in FIG. 7, in which the reference numerals 27 and 28 indicate the specimens Nos. 27 and 28, respectively.

It is possible to conclude the following from FIG. 7. (1) Specimen No. 27, containing Zr exhibits increase iHc compared with the control specimen No. 28. (2) A high iHc can be obtained in specimen No. 27 with up to 15% by weight of Fe.

EXAMPLE 13

Specimens Nos. 29 and 30, having the compositions shown in Table 13, were produced in accordance with the procedure described in Example 1.

Table 13

| Specimen No. | Composition of Alloys (wt. %) | | | | | Br (KG) | iHc (KOe) | (B.H)-max (MG . Oe) |
|---|---|---|---|---|---|---|---|---|
| | Sm | Co | Cu | Fe | Zr | | | |
| 29. (control) | 26.5 | 56.5 | 12.0 | 5.0 | 0 | 9.0 | 6.0 | 19.5 |
| 30. (invention) | 26.5 | 55.5 | 12.0 | 5.0 | 1.0 | 8.9 | 6.7 | 19.7 |

Table 13-continued

| Specimen No. | Composition of Alloys (wt. %) | | | | | Br (KG) | iHc (KOe) | (B.H)-max (MG . Oe) |
|---|---|---|---|---|---|---|---|---|
| | Sm | Co | Cu | Fe | Zr | | | |

The Cu contents of 12% by weight in specimens 29 and 30 has been believed by metallurgists to be necessary to provide the quaternary system alloy with a high iHc. As seen in Table 13, the addition of Zr also improves iHc at the high Cu content.

EXAMPLE 14

Specimen No. 31, having the composition shown in Table 14, was produced in accordance with the procedure described in Example 1. The Zr content was varied within the ranges shown in Table 14.

Table 14

| Specimen No. | Composition of Alloys (wt. %) | | | | |
|---|---|---|---|---|---|
| | Sm | Co | Cu | Fe | Zr |
| 31 | 26.5 | bal | 8.0 | 10.0 | 0–6 |

The influence of the Zr content on the coercive force is illustrated in FIG. 8. As is clear from FIG. 8, the iHc arrives at the maximum value at approximately 1% by weight of Zr. The iHc is too low when the Zr content exceeds 5% by weight. The iHc is extremely high at the Zr content of from 0.5 to 2.5% by weight.

EXAMPLE 15

Specimens Nos. 32 through 34, having the compositions as shown in Table 15, were produced in accordance with the procedure described in Example 1, except for the sintering and heat treatment conditions.

Table 15

| Specimen No. | Composition of Alloys (wt. %) | | | | |
|---|---|---|---|---|---|
| | Sm | Co | Cu | Fe | Zr |
| 32. (invention) | 25.5 | bal | 8.0 | 0–16 | 1.1 |
| 33. (control) | 25.5 | bal | 8.0 | 0–10 | 0 |
| 34. (control) | 26.5 | bal | 11.0 | 0–10 | 0 |

The Fe content was changed within the ranges shown in Table 15. The Cu content of specimen 34 was such that the highest (B.H)max was obtained without the addition of Zr.

The green compacts of specimens Nos. 32 through 34 were sintered at temperature of from 1170° to 1250° C., over a period of approximately one to two hours, and subsequently, after cooling to room temperature, were solution treated at temperature of from 1170° to 1230° C., followed by cooling to room temperature. The tempering was performed by a step tempering of from 850° to 400° C.

The influence of the Fe content on the magnetic properties i.e. iHc, Br and (B.H)max, is illustrated in FIG. 9, in which the reference numerals 32 through 34 indicate specimens No. 32 through 34, respectively. It is possible to the following conclude from FIG. 9. (1) Specimen No. 32 containing Zr according to the present invention and conventional Cu in a low amount, which is desirable for providing the Sm-Co-Fe-Cu, quaternary alloy with the high Br, maintains high iHc with the increase in the Fe content. (2) The (B H)max of

MANUFACTURING PROCESS OF SEMICONDUCTOR DEVICES

BACKGROUND OF THE INVENTION

The present invention relates to a process of manufacturing semiconductor devices, and more particularly to the method of manufacturing an isolated PN junction of a semiconductor mesa diode.

The manufacture of diodes by employing the conventional planar process, especially the contacting and encapsulating, is entailed by difficulties which are due to the PN-junction positioned on the surface. This PN-junction is protected by an $SiO_2$-layer, but owing to pressures exerted during the encapsulation, cracks are likely to result in the $SiO_2$-layer so that reverse currents are likely to develop.

As is known, a considerable disadvantage of the planar process is seen in the forming of bent diffusion fronts at the masking edges. It is known that this is not the case with the mesa process, but instead the mesa process is known to have other disadvantages, such as that the devices produced thereby have a non-protected PN-junction, and that the passivation is entailed by difficulties in the case of genuine mesa devices.

The German published patent application (DT-OS) No. 24 42 398 discloses a process of manufacturing a plurality of mesa semiconductor devices in which one side of a semiconductor substrate is provided on its entire surface with a PN-junction area which then, by employing a photolithographic etching process, is divided into mesas in accordance with the number of semiconductor devices, whereupon the substrate surface containing the mesas is provided with an oxidation layer. In this conventional process, the substrate is first readily diffused and the covering masking is applied after the mesas have been etched out. The position of the PN-junction and its angle in relation to the mesa surface is determined in this process, above all by the etching depth, with it being naturally difficult to reach the ideal value of 90° for the angle.

Considering that the masking is effected by thermal oxidation, the diffusion-out at the PN-junction lying at the edge of the mesas may cause a surface depletion at the marginal area. In consequence of this, it may happen that the angle already deviating from the ideal value is still changed more strongly. This increases the danger of a break-down of the loading of the diode.

SUMMARY OF THE INVENTION

Accordingly, it is the object of the invention to provide a process for manufacturing semiconductor devices not having the aforementioned disadvantages.

The present invention relates to a process in which on the surface of the semiconductor substrate of one conductivity type there is first only provided a coating with a doping agent resulting in the surface layer being of the other conductivity type, with the defining of the PN-junction being carried out by way of diffusion following the photolithographic process and the building of the mesas. A $SiO_2$-layer is produced simultaneously by way of thermal oxidation by working in an oxidizing atmosphere while the doping agent is diffused-in at the edges of the mesas. From this there will result a device which may be referred to as a quasi-mesa device combining the advantages of the electrical properties of a mesa device with the advantages of the planar technology. It is of particular advantage that the passivation in the process according to the invention is carried out with a thermally formed oxide which is produced in one step of the process together with the diffusion.

The devices manufactured in accordance with the process of the invention show to have a number of advantages. Thus, for example, it is possible to achieve high inverse voltages, and by utilizing the entire surface, it is possible to achieve a high current-carrying capacity, and the devices are insensitive to peak voltages, so that no destruction will occur during operation as a result of breakdown.

DETAILED DESCRIPTION OF THE INVENTION

The invention will now be explained in detail with reference to an example of embodiment shown in the accompanying drawings, in which silicon nitride is used as the diffusion masking.

Figure 1:
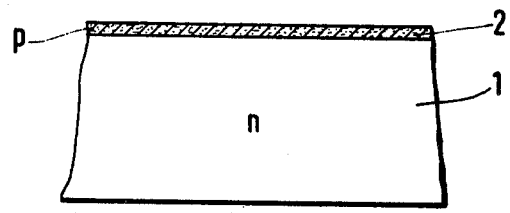
FIGS. 1–6 are sectional views taken through a semiconductor substrate during successive process steps according to the method of the present invention.

Following the usual cleaning process, the surface of the n-conductive silicon substrate 1 is coated throughout the entire surface with a doping agent, such as boron, resulting in a p-conductive surface layer 2 (FIG. 1). Both the temperature and the time of deposition depend on the later practical application of the devices to be manufactured. The doping is carried out in accordance with one of the conventional processes, such as by using boron nitride planar diffusion sources, or with the aid of $PH_3$. A coating with the aid of the hydrogen injection process is likewise possible.

Figure 2:
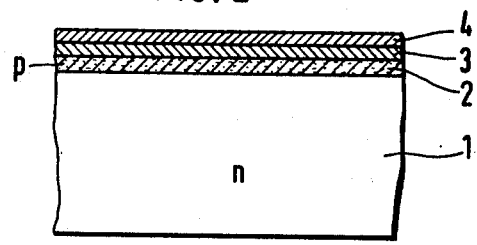

As a next step there is carried out, in accordance with FIG. 2, the deposition of a layer 3 of $Si_3N_4$ on the doped substrate 1, whereupon the layer 3 is covered with a $SiO_2$-layer 4. The latter serves as a masking for the $Si_3N_4$-layer 3 lying therebeneath, so that it is possible to work with phosphoric acid as the etching agent.

Figure 3:
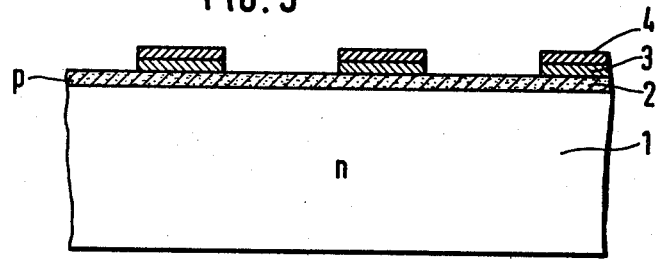

In the course of the next step of the process, the etching pattern is produced with the aid of the photolithographic process. The $SiO_2$-layer is first removed with the aid of a photomask, at those points where the silicon nitride layer 3 and, consequently, the p-doped substrate surface is to be exposed. The etching of the silicon dioxide masking is carried out with the conventional etching solutions, and the removal of the silicon nitride at the exposed points is carried out with the aid of phosphoric acid. The finished step of the process is shown in FIG. 3.

As a next step there is effected the structure etching of the silicon substrate material, with the silicon nitride layer 3 serving as the etching mask. In so doing, there is utilized the different reactivity of the etching solution with silicon and silicon nitride. Depending on what type of diode is desired, i.e. low-blocking, medium-blocking or high-blocking diodes, the depth of the etching groups can be controlled by employing three different etching times.

Figure 4:
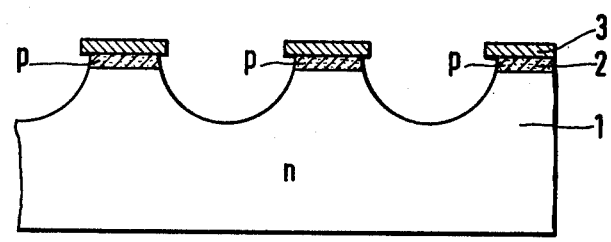

FIG. 4 shows the completed step of the process, and it is recognizable that in the course of the etching process there has also been removed the $SiO_2$-layer 4 as positioned over the silicon nitride layer 3. The geometry of the future device is now laid down, and the outlined mesa structure thereof becomes distinguishable.

Figure 5:
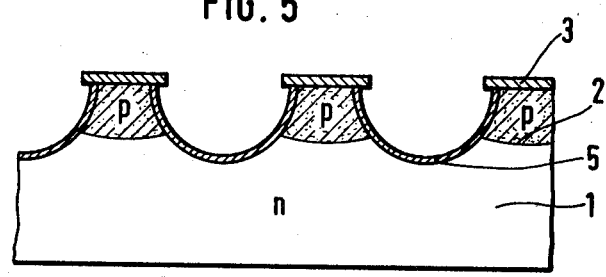

In the course of the hitherto performed process steps, the depth of the PN-junction 2' has not yet been fixed. This is carried out now in the following step, with the doped surface layer 2 as deposited in the course of the first step of the process, serving as a source. The diffusion is carried out in an oxidizing atmosohere, so that simultaneously, besides diffusing-in the doping agent, the oxide layer 5 as resulting at the edges of the mesa, will prevent a diffusion-out of the doping atoms. In the course of this, there results an almost flat diffusion front, and the angle in relation to the surface at the PN-junction 2' is close to the ideal value; even in the case of a relatively small diffusion depth, there will be obtained an almost rectangular profile (FIG. 5).

Figure 6:
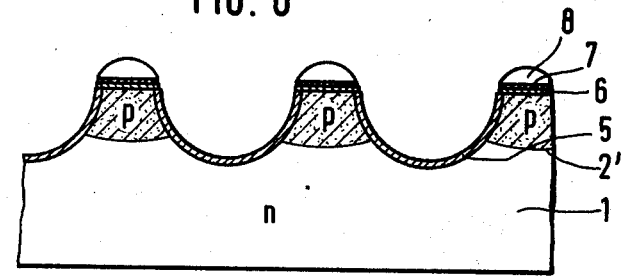

In the course of the last step of the process (FIG. 6), and subsequently to the removal of the silicon nitride layer 3 by way of etching out, there is produced an electric contact by evaporating various thin metal layers. In the course of this, there is first deposited a thin layer of titanium 6 over which there is then evaporated the silver layer 7. This step of the process is followed by a photoprocess with the aid of which there is enabled the growing of the contacts 8 on the mesa and surfaces in the contact bath. Prior to cutting (breaking) the semiconductor substrate into the individual devices, the titanium-silver layer is etched away between the contact surfaces.

In the present example of embodiment the etching of the $Si_3N_4$-layer was carried out with the aid of phosphoric acid, so that a $SiO_2$-layer was required as an etching mask. In cases where the work is carried out in accordance with the plasma etching process, the $SiO_2$-layer may be omitted, and the photoresist layer is deposited directly over the $Si_3N_4$-layer.

While we have described above the principles of our invention in connection with specific apparatus it is to be clearly understood that this description is made only by way of example and not as a limitation to the scope of our invention as set forth in the objects thereof and in the accompanying claims.

We claim:
1. A method of manufacturing a semiconductor device comprising the steps of:
   coating to one conductivity type by means of a doping agent the surface layer of a semiconductor substrate of the other conductivity type whereby a PN-junction is formed;
   forming a mesa structure from said substrate; and
   diffusing in said doping agent so as to fix the depth of the PN-junction within the semiconductor substrate while simultaneously passivating said mesa structure.
2. The method of claim 1 wherein passivating said mesa comprises forming an oxide layer thereon by thermal oxidation.
3. The method of claim 1 or 2 wherein said forming said mesa structure comprises etching said substrate through a patterned mask formed on said surface layer.
4. The method of claim 1 or 2 further including forming a contact on the surface layer of said mesa structure.
5. The method of claim 1 or 2 wherein said semiconductor substrate comprises a P-type conductivity.
6. A method of manufacturing a semiconductor diode comprising the steps of:
   coating to one conductivity type by means of a doping agent the surface layer of a semiconductor substrate of the other conductivity type whereby a PN-junction is formed;
   etching said substrate to produce a mesa; and
   diffusing said doping agent into said mesa to fix the depth of the PN-junction therein while simultaneously forming an oxide layer on said mesa thereby preventing out-diffusion of said doping agent by carrying out said diffusing in an oxidizing atmosphere.
7. The method of claim 6 wherein said doping agent comprises an N-type dopant.
8. The method of claim 6 or 7 wherein doping said surface layer comprises doping the entire surface layer with said doping agent.

* * * * *